July 15, 1958 A. J. W. M. VAN OVERBEEK 2,843,681

TRANSISTOR AMPLIFIER

Filed July 13, 1955

INVENTOR
ADRIANUS JOHANNES WILHELMUS
MARIE VAN OVERBEEK

BY Fred M. Vogel

AGENT

United States Patent Office 2,843,681
Patented July 15, 1958

2,843,681

TRANSISTOR AMPLIFIER

Adrianus Johannes Wilhelmus Marie van Overbeek, Eindhoven, Netherlands, assignor, by mesne assignments, to North American Philips Company, Inc., New York, N. Y., a corporation of Delaware Application July 13, 1955, Serial No. 521,851

Claims priority, application Netherlands August 4, 1954

4 Claims. (Cl. 179—171)

The present invention relates to transistor amplifiers. More particularly, the invention relates to circuit-arrangements including a transistor amplifier, between the emitter and the base of which at least a capacitor and an inductor connected in series are included in the indicated sequence. An object of the invention is to decrease unwanted reaction in the amplifier.

It has been found, that in transistor amplifiers there is usually troublesome reaction of the output of the amplifier upon the input thereof. Thus, variations in the output circuit for example in the output impedance of the transistor, react upon its input circuit. If, for example, the transistor amplifier is followed by a second transistor amplifier having a gain factor which is controlled by means of a control current, which control is usually accompanied by variation in the input impedance of the second amplifier, said variation becomes also manifest in the input circuit of the first-mentioned transistor amplifier, as a result of the reaction referred to. If, in addition, tuned circuits are included in the input and output circuits of the transistor, said reaction leads to unwanted coupling between the tuned circuits and this frequently involves unwanted asymmetry of the resonance curves of said circuits. Furthermore, circuit-arrangements without reaction such as, cathode-ray tube circuits, can usually be calculated and surveyed much more easily than transistor amplifiers exhibiting reaction.

It has previously been suggested that for decreasing reaction from the output of the amplifier upon the input thereof, the signal to be amplified should be supplied in phase opposition to the circuit between the collector and the emitter and to the circuit between the collector and the base of the transistor in a ratio substantially equal to the ratio between the emitter and base resistances of the transistor. However, such a circuit-arrangement is not particularly suitable for amplifying oscillations of high frequency, since the parasitic collector capacity of the transistor then adversely affects the decrease in reaction and furthermore at high frequencies the transistor is preferably operated in grounded-base connection, in which event a higher limit frequency of the gain factor is found.

In accordance with the present invention, a voltage set up across the collector circuit is supplied by way of a suitably proportioned resistor back to a point between the aforementioned inductor and capacitor.

In order that the invention may be readily carried into effect, it will now be described, by way of example, with reference to the accompanying drawing, in which.

Figure 1:
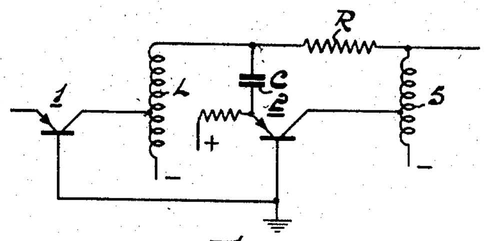
Fig. 1 is a schematic diagram of an embodiment of the circuit arrangement of the present invention.

Referring now to Fig. 1, the signal oscillations to be amplified are supplied by way of a transistor 1 to a transistor 2 in grounded-base connection. This is to be understood to mean that the base of the transistor 2 is common to its input and output circuits and thus must not necessarily be connected to ground without the interposition of impedances (see, for example Fig. 3). The input circuit, that is, the circuit between the emitter and the base of the transistor 2, includes in the indicated sequence a capacitor C in series with an inductor L, the resonance frequency of the series-circuit LC substantially corresponding to the signal frequency. This method of connection permits the obtaining of a high gain factor of the transistor 2.

For decreasing unwanted reaction, the voltage set up across the collector circuit is supplied by way of a resistor R back to the junction between the inductor L and the capacitor C. As will be shown with reference to the equivalent circuit diagram of Fig. 4, the reaction, which may be shown as a voltage source V which is active in the output circuit, is materially reduced with suitable proportioning of the resistor R, since the source V then produces a current in the inductor L which is substantially negligible.

Figure 4:
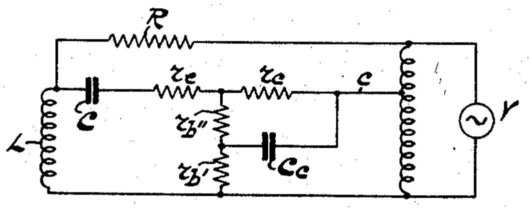
Fig. 4 is an equivalent circuit diagram of the embodiment of Fig. 1.

In Fig. 4, $r_e$ indicates the emitter resistance, $r_c$ indicates the collector resistance, $r_b'$ indicates the base resistance for high signal frequencies, viz, higher than the collector-base limit frequency of the transistor, and $r_b'+r_b''$ indicates that for low signal frequencies, viz. lower than the said limit frequency of the transistor. As is well-known, the behaviour of a transistor at high frequencies may be described by assuming a capacitor $C_c$ between the junction of the resistor $r_b'$, $r_b''$ and the collector $c$ of the transistor: At high signal frequencies, at which the impedance of the capacitor C has a low value with respect to that of the resistor $r_c$, the resistor $r_b$, has set up across it a voltage which leads in phase by substantially 90° with respect to the voltage V. This voltage would bring about an equivalent current through the inductor L in the absence of resistor R, since the circuit LC is in series-resonance for the signal frequency. The inductor L now has supplied to it, by way of resistor R, a second current which lags by 90° with respect to the voltage V, which current in addition has an amplitude equal to that of the first-mentioned current with suitable proportioning of resistor R and thus compensates the said current. If resistor R is arranged between the collector $c$ and the junction between L and C, it is required to have approximately the value $$R=\frac{L}{C_c r_b'}$$

Figure 2:
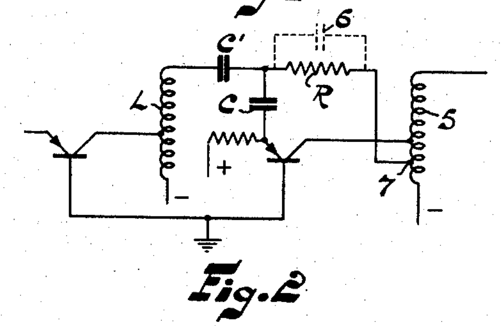
Fig. 2 is a modification of the embodiment of Fig. 1.

However, if resistor R is connected such as shown in Figs. 1, 4 and in Fig. 2, it must be given a value which is smaller or higher according to the transformation ratio of an output autotransformer 5.

In the foregoing considerations no allowance has been made for the influence of the parasitic capacity 6 parallel to resistor R (see Fig. 2) and that of the resistance $r_c$ parallel to the capacitor $C_c$ (see Fig. 4). The first-mentioned influence may be decreased, as shown in Fig. 2, by connecting resistor R to a tapping 7 on the output autotransformer 5 and/or by including a capacitor C′ between the junction of resistor R and capacitor C, so that the input series-circuit is then constituted by the circuit elements LC′C. In this case the capacity 6 has less influence upon the phase shift of the current supplied via the resistor R back to the inductor L.

In one practical embodiment of the circuit-arrangement of the invention $L=1.3$ millihenries, $C=100$ micromicrofarads, C′ was shortcircuited, $r_b=20$ ohms, $r_e=25$ ohms, $r_c=100$ kilohms, $C_c=40$ micromicrofarads, $R=52$ kilohms when connected to tapping 7 on ⅕ of the collector connection.

Figure 3:
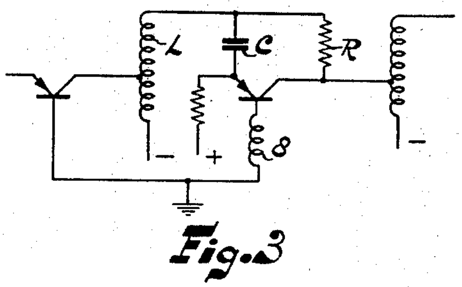
Fig. 3 is another modification of the embodiment of Fig. 1.

The two neglected influences may be substantially suppressed, as shown in Fig. 3, by including a small inductor 8 in the base circuit of the transistor 2, said inductor having a value which in the case under consideration must be approximately $$\frac{r_b'}{r_c}\cdot\frac{C}{C_c}\cdot L$$

What is claimed is:

1. A circuit arrangement comprising a transistor having emitter, collector and base electrodes, a capacitor and an inductor connected in series circuit arrangement with said capacitor, said series circuit arrangement being connected between an emitter and a base electrode of said transistor, means for applying an input signal to said emitter and base electrodes through said series circuit arrangement, said series circuit arrangement being resonant at the frequency of said input signal, means for deriving an output signal from a collector electrode of said transistor, and a resistor connected between a point on said output means and the junction between said capacitor and said inductor, said resistor having a resistance value at which the current flow through the said inductor due to an output signal is substantially negligible.

2. A circuit arrangement comprising a transistor having emitter, collector and base electrodes, a first capacitor, a second capacitor connected in series with said first capacitor, an inductor connected in series circuit arrangement with said first and second capacitors, said series circuit arrangement being connected between an emitter and base electrode of said transistor, means for applying an input signal to said emitter and base electrodes through said series circuit arrangement, said series circuit arrangement being resonant at the frequency of said input signal, means for deriving an output signal from a collector electrode of said transistor, and a resistor connected between a point on said output means and the junction between said first and second capacitors, said resistor having a resistance value at which current flow through the said inductor due to an output signal is substantially negligible.

3. A circuit arrangement comprising a transistor having emitter, collector and base electrodes, a capacitor, a first inductor connected in series circuit arrangement with said capacitor, said series circuit arrangement being connected between an emitter and base electrode of said transistor, a second inductor interposed between said series circuit arrangement and said base electrode, means for applying an input signal to said emitter and base electrodes through said series circuit arrangement, said series circuit arrangement being resonant at the frequency of said input signal, means for deriving an output signal from a collector electrode of said transistor, and a resistor connected between a point on said output means and the junction between said capacitor and said first inductor, said resistor having a resistance value at which the current flow through the said first inductor due to an output signal is substantially negligible.

4. A circuit arrangement comprising a transistor having emitter, collector and base electrodes, said transistor exhibiting an internal base resistance at signal frequencies higher than the collector-base limit frequency of said transistor, an internal base resistance at signal frequencies lower than the collector-base limit frequency of said transistor and an internal capacitance between a collector electrode and a base electrode of said transistor, a capacitor, an inductor connected in series circuit arrangement with said capacitor, said series circuit arrangement being connected between an emitter and said base electrode of said transistor, means for applying an input signal to said emitter and base electrodes through said series circuit arrangement, said series circuit arrangement being resonant at the frequency of said input signal, means for deriving an output signal from said collector electrode, and a resistor connected between a point on said output means and the junction between said capacitor and said inductor, said resistor having a resistance value substantially determined by the relationship $$R = K\frac{L}{C_c r_b'}$$

where K is a constant determined by the point of connection of said resistor on said output means, R is the resistance value of said resistor in kilohms, L is the inductance of said inductor in millihenries, $C_c$ is the capacitance of said internal collector-base capacitance in micromicrofarads and $r_b'$ is said internal base resistance at signal frequencies higher than said collector-base limit frequency in ohms thereby causing the current flow through the said inductor due to an output signal to be substantially negligible.

References Cited in the file of this patent

UNITED STATES PATENTS

| | | |
|---|---|---|
| 1,968,104 | Roberts | July 31, 1934 |
| 2,662,124 | McMillan | Dec. 8, 1953 |
| 2,663,766 | Meacham | Dec. 22, 1953 |
| 2,680,160 | Yaeger | June 1, 1954 |